United States Patent
Wei et al.

(10) Patent No.: US 9,136,088 B2
(45) Date of Patent: Sep. 15, 2015

(54) DETECTION APPARATUS AND OPERATING METHOD

(75) Inventors: Zhen Wei, Beijing (CN); Chengda Zhu, Beijing (CN); Kiyoung Kwon, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 224 days.

(21) Appl. No.: 13/450,893

(22) Filed: Apr. 19, 2012

(65) Prior Publication Data

US 2012/0266700 A1    Oct. 25, 2012

(30) Foreign Application Priority Data

Apr. 21, 2011  (CN) .......................... 2011 1 0101164

(51) Int. Cl.
*G01N 37/00* (2006.01)
*H01J 37/18* (2006.01)
*G02F 1/13* (2006.01)

(52) U.S. Cl.
CPC ............. *H01J 37/185* (2013.01); *G02F 1/1309* (2013.01); *G02F 2203/69* (2013.01); *H01J 2237/2811* (2013.01); *H01J 2237/2817* (2013.01)

(58) Field of Classification Search
USPC ........................................................ 73/865.6
See application file for complete search history.

(56) References Cited

U.S. PATENT DOCUMENTS

| 6,759,867 | B2 * | 7/2004 | Sohn .......................... 324/750.25 |
| 7,095,242 | B2 * | 8/2006 | Bjork ........................ 324/750.05 |
| 7,245,142 | B2 * | 7/2007 | Tanaka et al. ............. 324/750.22 |
| 2002/0009120 | A1 * | 1/2002 | Sugimoto et al. ............... 374/57 |
| 2007/0296437 | A1 * | 12/2007 | Johnston et al. .............. 324/761 |

FOREIGN PATENT DOCUMENTS

| CN | 1797006 A | 7/2006 |
| CN | 201345018 Y | 11/2009 |
| CN | 101776700 A | 7/2010 |
| KR | 20090006688 A | 1/2009 |
| KR | 20100107175 A | 10/2010 |

OTHER PUBLICATIONS

Second Chinese Office Action dated Jul. 9, 2014; Appln. No. 201110101164.X.
First Chinese Office Action dated Feb. 8, 2014: Appln. No. 201110101164.X.
Third Chinese Office Action Appln. No. 201110101164.X; Issued Sep. 22, 2014.

* cited by examiner

*Primary Examiner* — Hezron E Williams
*Assistant Examiner* — Mark A Shabman
(74) *Attorney, Agent, or Firm* — Ladas & Parry LLP

(57) ABSTRACT

The disclosed technology provides a detection apparatus and its operating method. The disclosed technology provides a detection apparatus, comprising: a test chamber, an exchange chamber, and a communicating mechanism, which is provided between the test chamber and the exchange chamber and capable of rendering the test chamber and the exchange chamber separated from or communicated with each other; wherein transmission devices are positioned within the test chamber and the exchange chamber, respectively, and the transmission devices are adapted to convey a probe frame from the test chamber to the exchange chamber or from the exchange chamber to the test chamber.

11 Claims, 3 Drawing Sheets

DETECTION APPARATUS AND OPERATING METHOD

BACKGROUND

Embodiments of the disclosed technology relate to the region of mechanical techniques, particularly relates to a detection apparatus and an operating method.

Electron beam matrix detection technique is one of the most common detection techniques in the industry of TFT-LCD (Thin Film Transistor Liquid Crystal Display). The detection results can be achieved, usually in a vacuum environment, by inputting signals to the pads on the substrate to be tested through a probe frame in a test chamber, and then testing the pixels applied with the signals. To different product types, effective test can be performed on glass substrates to be tested only when corresponding probe frame has been employed, because glass substrates of different types have different shapes and pad arrangement. In current industry, although many improvements have been made on the product design and probe frame structure, it is also unavoidable to install and replace probe frames during manufacturing.

During the process of installation or replacement of above-mentioned probe frames, the inventors have noted there exists at least the following problems. Due to the larger volume of the test chamber, a longer timer period is needed for restoring the vacuum environment which is required during the test chamber detection after the test chamber is opened for installing or exchanging the probe frame, and detecting efficiency decreases greatly.

SUMMARY

The embodiments of this disclosed technology provide a detection apparatus and its operating method, which can improve detecting efficiency effectively.

An aspect of the disclosed technology provides a detection apparatus, comprising a test chamber, an exchange chamber, and a communicating mechanism, which is provided between the test chamber and the exchange chamber and capable of rendering the test chamber and the exchange chamber separated from or communicated with each other; wherein transmission devices are positioned within the test chamber and the exchange chamber, respectively, and the transmission devices are adapted to convey a probe frame from the test chamber to the exchange chamber or from the exchange chamber to the test chamber.

Another aspect of the disclosed technology provides a method for operating the detection apparatus, comprising: separating an exchange chamber of a detection apparatus from a test chamber of the detection apparatus; vacuum pumping of the exchange chamber, such that the vacuum level in the exchange chamber is same as that in the test chamber; communicating the exchange chamber with the test chamber; and conveying a probe frame from the test chamber to the exchange chamber or from the exchange chamber to the test chamber.

With the detection apparatus and the operating method provided by the embodiments of this disclosed technology, due to the test chamber and exchange chamber capable of communicating with or separating from the test chamber comprised in detection apparatus, vacuum pumping operation can be performed to the exchange chamber separated from the test chamber with the exchange chamber as intermediation. When the vacuum level of the exchange chamber is the same as that of the test chamber, the exchange chamber is communicated with the test chamber, and a probe frame is conveyed from the test chamber to the exchange chamber or from the exchange chamber to the test chamber. In this way, during the procedure of exchanging the probe frame, the vacuum environment in the test chamber is not disadvantageously affected, and it is not necessary to wait for the restoration of vacuum environment in the test chamber, thus the time required for exchanging probe frame can be decreased, and the detecting efficiency can be improved effectively.

Further scope of applicability of the present disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF THE DRAWINGS

The present disclosed technology will become more fully understood from the detailed description given hereinafter and the accompanying drawings which are given by way of illustration only, and thus are not limitative of the present disclosed technology and wherein.

DETAILED DESCRIPTION

A detailed description will be given in the following about the technical solutions of the embodiments of this disclosed technology in conjunction with the drawings of the embodiments of this disclosed technology. It should be noted, the embodiments described blow are only part of and not all of the embodiments of this disclosed technology. The other embodiments conceived by those skilled in the relevant technical field based on the described embodiments of this disclosed technology without any inventive work are in the protection scope of this disclosed technology.

Figure 1:
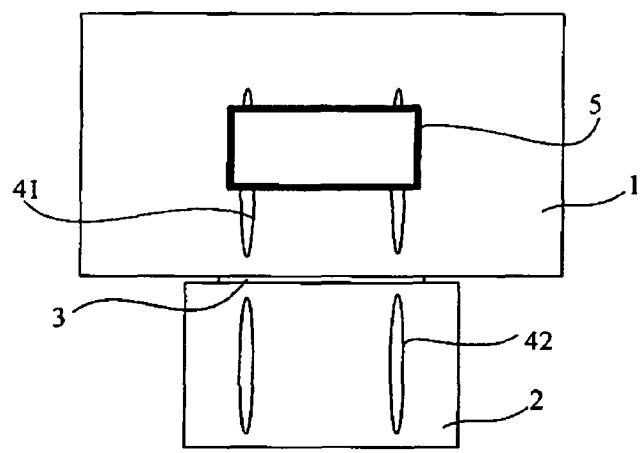
FIG. 1 is a structural schematic top view of a detection apparatus according to a embodiment of this disclosed technology.

As shown in FIG. 1, the embodiment of this disclosed technology provides a detection apparatus, comprising a test chamber 1 and an exchange chamber 2, and a communication mechanism 3 is provided between the test chamber 1 and the exchange chamber 2, with which the test chamber 1 and the exchange chamber can be separated from or communicated with each other.

A transmission device 41 is provided within the test chamber 1, and a transmission device 42 is provided within the exchange chamber 2. The transmission device 41 and the transmission device 42 are used to convey a probe frame 5, and can convey the probe frame 5 from the test chamber 1 to the exchange chamber 2 or from the exchange chamber 2 to the test chamber 1.

In performing detection with the detection apparatus provided by the embodiment of this disclosed technology, the communication mechanism 3 is in a closing state of separating the test chamber 1 from exchange chamber 2, the probe frame 5 is disposed within the test chamber 1, and an object to be tested (for example an array substrate) is positioned below the probe frame 5. The test chamber 1 is pumped to the vacuum level required by detection, and the object to be tested is detected in the vacuum environment within the test chamber 1.

When it is necessary to change the probe frame 5, the exchange chamber 2 is first subjected to a vacuum pumping operation when the communication mechanism 3 is kept in the closing state, in which the exchange chamber 2 and the test chamber 1 are separated from each other. When the vacuum level in the exchange chamber 2 is the same as that in the test chamber 1, the communication mechanism 3 is brought into an opening state for communicating the test chamber 1 with the exchange chamber 2, and the original probe frame 5 is conveyed from the test chamber 1 to the exchange chamber 2 or the replaced probe frame 5 is conveyed from the exchange chamber 2 to the test chamber 1 by the transmission device 41 and transmission device 42. Thereafter, the communication mechanism 3 is closed so as to separate the test chamber 1 from the exchange chamber 2 again.

In this way, with the detection apparatus provided by the embodiment of this disclosed technology, the vacuum environment in the test chamber 1 during the procedure of exchanging the probe frame with the exchange chamber 2 as intermediation is not disadvantageously affected, and it is not necessary to wait for the restoration of vacuum environment in the test chamber, thus the time required for exchanging probe frame decreased, and the detecting efficiency improved effectively.

In an example, the volume of the exchange chamber 2 is smaller than that of the test chamber 1, and the volume of the exchange chamber 2 may be just for the probe frame being arranged completely therein and be capable of being conveyed by transmission device 42 so as to decrease the time for the vacuum pumping of the exchange chamber 2 to reach the same vacuum level as that in the test chamber 1, thus the time for replacing a probe frame can be further decreased and detecting efficiency can be improved effectively.

An example of the communication mechanism 3 is a valve, and when the valve is opened, the test chamber 1 and the exchange chamber 2 are communicated with each other, but when the valve is close, the test chamber 1 and the exchange chamber 2 are separated from each other. The communication mechanism 3 may be a sealing valve so as to effectively prevent the vacuum level in the test chamber 1 from being disadvantageously affected. Of course, the communication mechanism 3 can also be another structure allowing the test chamber 1 and the exchange chamber 2 to be communicated with or separated from each other, such as flap, and the present disclosed technology is not limited thereto.

The transmission device 41 and the transmission device 42 can be realized in various ways, for example, a transmission roller wheel or a conveyor belt; Such a transmission roller wheel or a conveyor belt can not only support the probe frame 5 placed thereon but also transport the same, that is, convey the probe frame 5 within the test chamber 1 and the exchange chamber 2.

Furthermore, both of the transmission device 41 and the transmission device 42 can have a transmission rail. For the transmission device realized with transmission roller wheels, its transmission rail comprises the transmission roller wheels arranged in a certain order, while for the transmission device realized with a conveyor belt, the running path forms its transmission rail. The probe frame 5 is conveyed along the transmission rails of the transmission device 41 and the transmission device 42 from the exchange chamber 2 to the test chamber 1 or from the test chamber 1 to the exchange chamber 2. It should be noted that the width of the transmission rail of transmission device 41 could be greater than, equal to or less than the width of the transmission rail of the transmission device 42, as long as the transmission for the probe frame 5 arranged thereon can be ensured. This disclosed technology is not limited thereto.

Although there is no physical connection between the transmission device 41 and the transmission device 42 due to the existence of the communication mechanism 3, before probe frame 5 runs out of any one of the transmission device 41 and the transmission device 42, the physical dimension of the probe frame 5 is enough to make the probe frame 5 runs into the other transmission device when it is conveyed along the transmission rails, thereby a reliable conveyance for the probe frame 5 is ensured between the test chamber and the exchange chamber.

Further, to avoid deviation occurred when the probe frame 5 is delivered on the transmission rails, guiding members can be optionally arranged on either side or both sides of the transmission rails of the transmission device 41 and the transmission device 42, such as guiding wheels. Guiding members are preferably provided on both sides of the transmission rails while guiding the probe frame 5, thus the damage caused by the deviation of the probe frame 5 when being conveyed and thereby impaction with other devices can be prevented effectively. It should be noted that the guiding member can make the probe frame 5 not only run in a linear way, but also turn at a certain angle if required, and the mounting position and the numbers of the guiding members are not limited.

Figure 2:
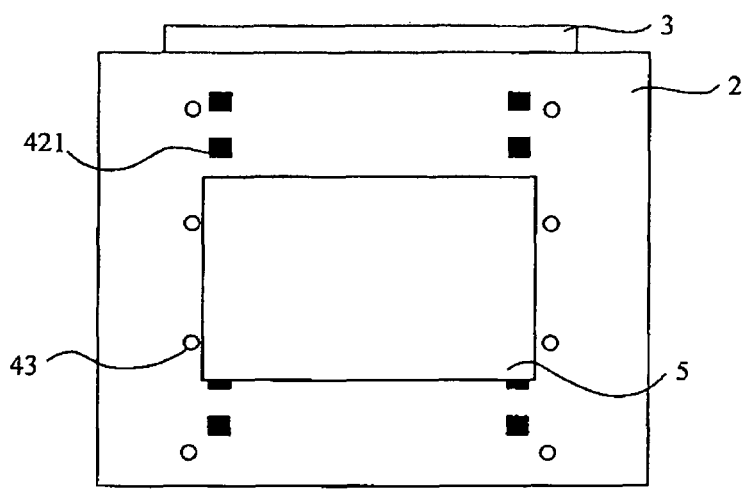
FIG. 2 is a structural schematic top view of a exchange chamber in the detection apparatus according to a embodiment of this disclosed technology.

A detail description is made for the detection apparatus according to the disclosed technology, by taking one specific example of the transmission device 42 within the exchange chamber 2 as an example. As shown in FIG. 2, the example of the transmission device 42 comprises two rows of transmission roller wheels 421, and the transmission roller wheels 421 are positioned on the both sides within the exchange chamber 2 and can roll in a clockwise or counter-clockwise direction, and transfer the probe frame 5 placed thereon with static friction force, thereby the probe frame 5 can be moved forward or backward on the transmission rail. The distance between the two rows of roller wheels may be slightly smaller than the width of the probe frame 5 so as to support and convey the probe frame 5. Of course, in this embodiment, the rows of transmission roller wheels are not limited to two rows, and any arrangements allowing the conveyance of the probe frame 5 to the test chamber are within the protection scope of this disclosed technology.

To delivery the probe frame 5 on the transmission rail while avoiding deviation, guiding wheels (guiding members) 43 are arranged on the both sides of the transmission rail. The guiding wheel 43 and the probe frame 5 are on the same horizontal position. When the delivery direction of the probe frame 5 is deviated from the transmission rail, one side of probe frame 5 may contact the guiding wheel 43 and then return onto transmission rail under the action of the guiding wheel 43.

Optionally, in this example, the two rows of the transmission roller wheels can be arranged as a structure retractably fixed onto the inner wall of the exchange chamber 2, so that they are held onto the inner wall of the exchange chamber 2 when out of operation and project and stay when operated, thus the flexible adjustment of the width of the transmission rail is facilitated without bad effect on the other usage of the exchange chamber 2.

It should be noted that, in the embodiment of this disclosed technology, the structure of transmission device 42 shown in FIG. 2 is also applicable to the transmission device 41, and the detailed description thereto is omitted here.

Figure 3:
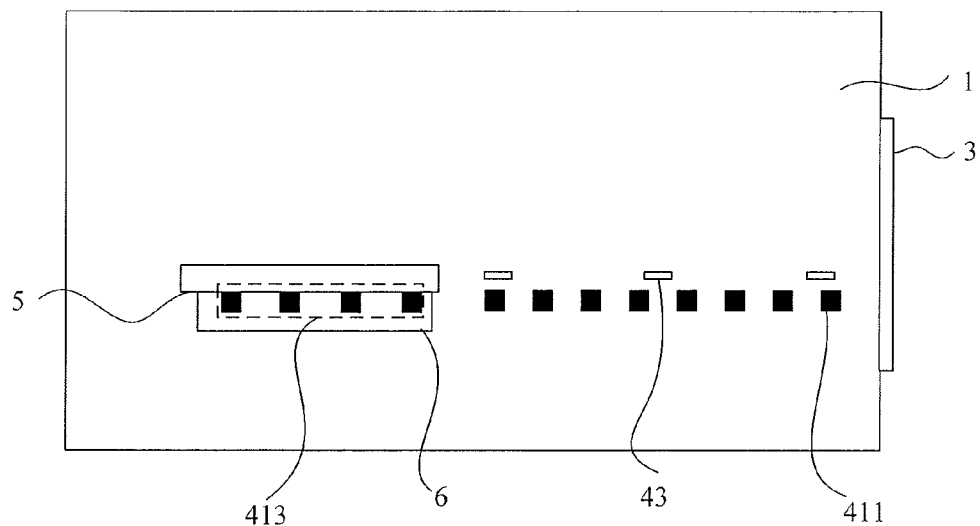
FIG. 3 is a structural schematic side view of a detection apparatus according to a embodiment of this disclosed technology.

In one embodiment of this disclosed technology, as shown in FIG. 3, a supporting bracket 6 matching the shape of probe frame 5 is arranged within the test chamber 1, and when the probe frame 5 is conveyed into the test chamber 1, the transmission device 41 in the test chamber 1 places the probe frame 5 onto the supporting bracket 6. For settling the probe frame 5 onto the supporting bracket 6 smoothly, the transmission device 41 in this embodiment comprises transmission part 413s (as shown as the dotted frame portion in FIG. 3) capable of conveying the probe frame 5 onto the supporting bracket 6 in addition to the transmission roller wheels 411 near the communication mechanism 3 and the guiding wheels 43. Transmission parts 413 can be transmission roller wheels provided on the supporting bracket 6; it should be understood that the disclosed technology is not limited to the specific structure and mounting positions. For example, sliding devices and the like which can settle the probe frame 5 on the supporting bracket 6. Generally, the transmission device 41 can not only convey the probe frame 5 in a predetermined direction, but also convey the probe frame 5 accurately to the supporting bracket 6, to perform the subsequent detecting work.

In order to enable the solid coupling between the probe frame 5 and the supporting bracket 6 and thus avoid the deterioration to detecting precision and reliability caused by the occurrence of relative slip between the probe frame 5 and the supporting bracket 6 during the subsequent detecting steps, in one embodiment of this disclosed technology, a clamping device is positioned on the supporting bracket 6 for example, such as a jig or fixture etc., such that the probe frame 5 placed on the supporting bracket 6 can be fixed.

Figure 4:
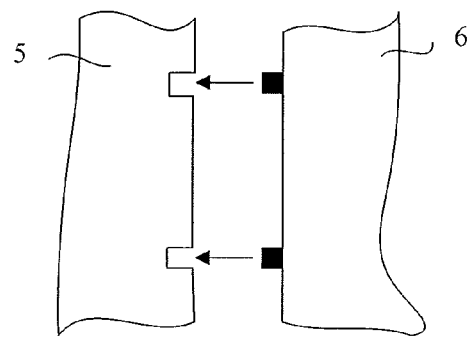
FIG. 4 is a schematic view illustrating engagement of a clamping device and a locking device in the detection apparatus according to the embodiment of the disclosed technology.

In another embodiment of the present disclosed technology, a clamping device is provided on the supporting bracket 6, and a locking device corresponding to the clamping device is provided on the probe frame 5; the clamping device and the locking device can engage with each other through respective mechanical structures so as to secure the probe frame 5 onto the supporting bracket 6. As shown in FIG. 4, the examples of the clamping device comprises bosses, and the examples of the locking device comprises grooves matching with the bosses, the docking of the grooves and the bosses secure the probe frame onto the supporting bracket; Or, clamping device comprises grooves, the locking device comprises bosses matching with the grooves, the docking between the grooves and the bosses secures the probe frame 5 onto the supporting bracket 6.

In addition to the foregoing bosses and grooves, the clamping device and locking device provided by the embodiment of this disclosed technology can also comprise locking bolts, locking snaps and the like, which can secure the probe frames 5 onto the supporting brackets 6, and the present disclosed technology is not limited thereto.

Figure 5:
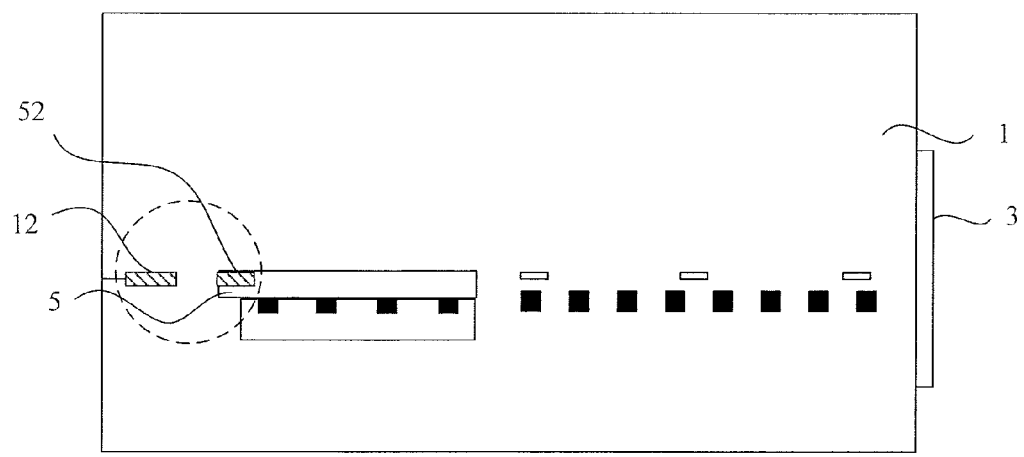
FIG. 5 is a structural schematic side view of a detection apparatus according to the embodiment of this disclosed technology.

After the probe frame 5 is secured onto the supporting bracket 6, electrical signals can be input to the object to be tested below the probe frame 5 through the probe frame 5, so as to detect the object to be tested. As show in FIG. 5, a removable signal wire connection member 12 is provided within the test chamber 1, and a signal wire docking portion 52 is provided on the probe frame 5 for connecting with the signal wire connection member 12. After the probe frame 5 is placed on the supporting bracket 6, the signal wire connection member 12 moves toward the probe frame 5 and connects with the signal wire docking portion 52 on the probe frame 5 to perform the detection.

Figure 6:
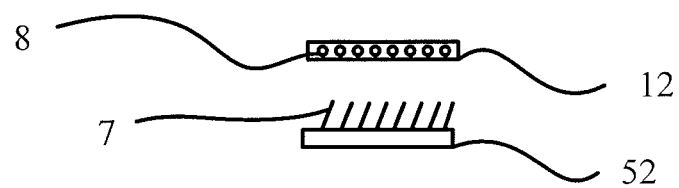
FIG. 6 is a schematic view illustrating the connection mode between a signal wire connection member and a signal wire docking portion of the dotted portion shown in FIG. 5.

As shown in FIG. 6, the signal wire connection member 12 comprises signal wire docking pins 7, and the signal wire docking portion 52 comprises signal wire docking holes 8, and the engagement of the signal wire docking pins 7 and the signal wire docking holes 8 connects the signal wire connection member 12 with the signal wire docking portion 52. The positions of the signal wire docking pins 7 and the signal wire docking hole 8 are also interchangeable, that is, the signal wire connection member 12 comprises signal wire docking holes 8, while the signal wire docking portion 52 comprises the signal wire docking pins 7, and the engagement of the signal wire docking pins 7 and the signal wire docking holes 8 connects the signal wire connection member 12 with the signal wire docking portion 52.

Figure 7:
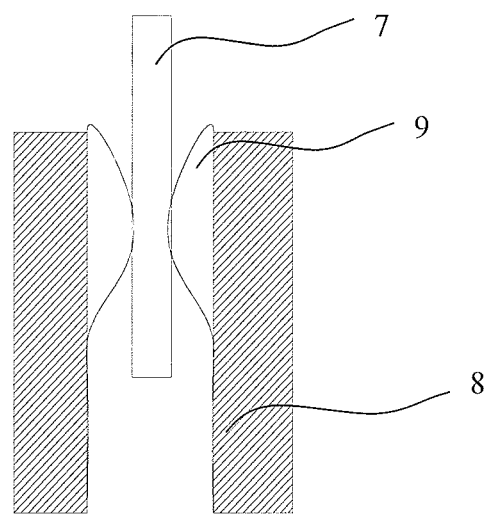
FIG. 7 is a schematic view illustrating the specific connection mode between the signal wire connection member and the signal wire docking portion shown in FIG. 6.

In an example, as shown in FIG. 7, to ensure the stable engagement between the signal wire docking holes 8 and the signal wire docking pins 7, a metal elastic reed 9 is further provided on the inner wall of each signal wire docking hole 8, which can establish a tight engagement with the signal wire connection member 12 under the action of elasticity, thus a reliable connection is realized between the signal wire connection member 12 and the signal wire docking portion 52.

It should be noted, although the detection apparatus provided by the embodiment of this disclosed technology is applicable for the object detection in a vacuum environment, the present disclosed technology is not limited to the specific operating conditions thereof. Moreover, in the detection apparatus provided by the embodiment of this disclosed technology, the transmission path of the probe frame maybe in a straight line or a curve line as well, and the transmission direction can be in a horizontal direction or form an angle with respect to the horizontal direction, or can be in a vertical direction, and this disclosed technology is not limited thereto.

In the detection apparatus provided by the embodiment of this disclosed technology, the test chamber 1 and the exchange chamber 2 are capable of communicating with or separating from each other, a vacuum pumping process can be performed on the exchange chamber 2 when separated from the test chamber 1, and then with the exchange chamber 2 as a intermediation, the probe frame is replaced. When the vacuum level exchange chamber 2 is the same as that of test chamber 1, the exchange chamber 2 communicates with the test chamber 1, and the probe frame 5 is conveyed from test chamber 1 to the exchange chamber 2 or from the exchange chamber 2 to the test chamber 1. In this way, the vacuum environment in the test chamber 1 will not be disadvantageously affected, and it is not necessary to wait for the recovery of the vacuum environment in the test chamber during the procedure of replacing the probe frame 5; therefore, the time for replacing the probe frame is decreased and thus the detecting efficiency is improved effectively.

Corresponding to the aforementioned embodiment of the detection apparatus, the present disclosed technology also provides a method for operating the detection apparatus. An embodiment of the method for operating the detection apparatus comprises the following steps.

S11, separating an exchange chamber from a test chamber of the detection apparatus.

S12, vacuum pumping the exchange chamber.

In this step, the purpose of vacuum pumping the exchange chamber is to obtain a same vacuum level both in the exchange chamber and the test chamber. It should be noted, due to various factors from technology and circumstance, in this embodiment, the vacuum level of the exchange chamber and the vacuum level of the test chamber may be not the perfectly same; and in the embodiment of this disclosed technology, "the vacuum level of exchange chamber and the vacuum level of test chamber are same" is also connected with "being substantially same"; for example, when both vacuum levels are at the same order of magnitude, the two levels are deemed as same.

S13, communicating the exchange chamber with the test chamber.

S14, conveying a probe frame from the test chamber to the exchange chamber or from the exchange chamber to the test chamber.

The operating method provided by the embodiment of this disclosed technology firstly performs a vacuum pumping process with respect to the exchange chamber, and then conveys a probe frame from the test chamber to the exchange chamber or from the exchange chamber to the test chamber.

In this way, during the procedure of exchanging the probe frame, the vacuum environment in the test chamber is not disadvantageously affected, and it is not necessary to wait for the restoration of vacuum environment in the test chamber, thus the time required for exchanging probe frame is decreased, and the detecting efficiency can be improved effectively.

Further, after conveying the probe frame from the exchange chamber to the test chamber, the operating method provided by the embodiment of this disclosed technology may further comprise the following operations.

The probe frame is held onto a supporting bracket within the test chamber; after conveying of the probe frame to the detecting position, holding the probe frame onto the supporting bracket can avoid the shifting of the probe frame during the subsequent detection, thus further ensures detective precision and reliability.

The probe frame is connected with signal wires so as to provide detecting signals for the objects to be tested through probe frame.

When it is required to convey the probe frame from the test chamber to the exchange chamber, if the probe frame is held onto the supporting bracket within the test chamber and connects with the signal wires, then before conveying of the probe frame from the test chamber to the exchange chamber, the operating method of the detection apparatus provided by the embodiment of this disclosed technology may further comprise: disconnecting the probe frame from the signal wires; and unlocking the probe frame from the supporting bracket within the test chamber. Thereby, the damage to the signal wires and the supporting bracket when the probe frame is conveyed from test chamber to exchange chamber can be avoided.

After conveying of the probe frame from the test chamber to the exchange chamber, it is enough to separate again the test chamber from the exchange chamber and open the exchange chamber to get out the probe frame.

All that described above are only specific embodiments of this disclosed technology, but the protection scope of this disclosed technology is not limited thereto, it's easy for the skilled in this art to conceive modification or alternation within the technical scope disclosed by this disclosed technology, which should be encompassed in the protection scope of this disclosed technology. Therefore, the protection scope of this disclosed technology should be in accord with the protection scope of claims.

What is claimed is:

1. A detection apparatus, comprising
   a test chamber provided with a signal wire connection member therein,
   an exchange chamber,
   a communicating mechanism, which is provided between the test chamber and the exchange chamber and capable of rendering the test chamber and the exchange chamber separated from or communicated with each other;
   a probe frame provided within the test chamber; and
   a supporting bracket provided within the test chamber and matching a shape of the probe frame;
   wherein transmission devices are positioned within the test chamber and the exchange chamber, respectively, and the transmission devices are adapted to convey a probe frame from the test chamber to the exchange chamber or from the exchange chamber to the test chamber,
   the probe frame is configured to be detachably mounted on the supporting bracket and detachably connected to the signal wire connection member provided within the test chamber; and the transmission device within the test chamber comprises a transmission part configured for conveying the probe frame onto the supporting bracket.

2. The detection apparatus according to claim 1, wherein the volume of the exchange chamber is smaller than that of the test chamber.

3. The detection apparatus according to claim 1, wherein either of the transmission devices comprises transmission roller wheels or a conveyor belt.

4. The detection apparatus according to claim 1, wherein either of the transmission devices comprises a transmission rail, and at least one side of the transmission rail is provided with guiding members.

5. The detection apparatus according to claim 1, wherein the transmission part is provided onto the supporting bracket.

6. The detection apparatus according to claim 5, wherein the supporting bracket is provided with a clamping device so as to secure the probe frame onto the supporting bracket.

7. The detection apparatus according to claim 6, wherein the probe frame is provided with a locking device corresponding to the clamping device thereon; and
   the engagement between the clamping device and the locking device secures the probe frame onto the supporting bracket.

8. The detection apparatus according to claim 7, wherein the clamping device comprises at least a boss, the locking device comprises at least a groove matching with the boss, and the docking of the groove and the boss secures the probe frame onto the supporting bracket; or
   the clamping device comprises at least a groove, the locking device comprises at least a boss matching with the groove, and the docking of the groove and the boss secures the probe frame onto the supporting bracket.

9. The detection apparatus according to claim 1, wherein the signal wire connection member provided within the test chamber is movable;
   the probe frame is provided with a signal wire docking portion used to connect with the signal wire connection member; and the probe frame connects with signal wires by the connecting between the signal wire connection member and the signal wire docking portion.

10. The detection apparatus according to claim 9, wherein the signal wire connection member comprises signal wire docking pins, the signal wire docking portion comprises signal wire docking holes, and the engagement between the signal wire docking pins and the signal wire docking holes enables the interconnection between the signal wire connection member and the signal wire docking portion;

or the signal wire connection member comprises signal wire docking holes, the signal wire docking portion comprises signal wire docking pins, and the engagement between the signal wire docking holes and the signal wire docking pins enables the interconnection between the signal wire connection member and the signal wire docking portion.

11. The detection apparatus according to claim 10, wherein metal elastic reeds are provided onto the inner wall of each of the signal wire docking holes for establishing a tight engagement with the signal wire docking pins.

\* \* \* \* \*